(12) United States Patent
Park et al.

(10) Patent No.: US 7,205,660 B2
(45) Date of Patent: Apr. 17, 2007

(54) WAFER LEVEL CHIP SCALE PACKAGE HAVING A GAP AND METHOD FOR MANUFACTURING THE SAME

(75) Inventors: Myeong-Soon Park, Suwon-si (KR); Hyun-Soo Chung, Hwaseong-si (KR); In-Young Lee, Yongin-si (KR); Jae-Sik Chung, Hwaseong-si (KR); Sung-Min Sim, Seongnam-si (KR); Dong-Hyeon Jang, Suwon-si (KR); Young-Hee Song, Seongnam-si (KR); Seung-Kwan Ryu, Yongin-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 0 days.

(21) Appl. No.: 11/186,763

(22) Filed: Jul. 22, 2005

(65) Prior Publication Data

US 2006/0214293 A1 Sep. 28, 2006

(30) Foreign Application Priority Data

Mar. 22, 2005 (KR) .................. 10-2005-0023746

(51) Int. Cl.
*H01L 23/48* (2006.01)

(52) U.S. Cl. ............... 257/737; 257/773; 257/778; 257/E23.023; 438/613

(58) Field of Classification Search ............... 257/737, 257/738, 773, 778, E23.023
See application file for complete search history.

(56) References Cited

U.S. PATENT DOCUMENTS

2002/0175409 A1* 11/2002 Tsubosaki ............... 257/737
2003/0052156 A1* 3/2003 Kim et al. ............... 228/180.22

FOREIGN PATENT DOCUMENTS

| JP | 2000-228423 | 8/2000 |
| KR | 1020020000692 A | 1/2002 |
| KR | 1020030068376 A | 8/2003 |

* cited by examiner

*Primary Examiner*—Evan Pert
*Assistant Examiner*—Krista Soderholm
(74) *Attorney, Agent, or Firm*—Harness, Dickey & Pierce, P.L.C.

(57) ABSTRACT

A wafer level chip scale package may have a gap provided between a solder bump and a bump land. The gap may be filled with a gas. A method of manufacturing a wafer level chip scale package may involve forming a redistribution line having a first opening, forming a seed metal layer having a second opening including an undercut portion, and forming the gap using the first and the second openings.

10 Claims, 10 Drawing Sheets

WAFER LEVEL CHIP SCALE PACKAGE HAVING A GAP AND METHOD FOR MANUFACTURING THE SAME

PRIORITY STATEMENT

This U.S. non-provisional application claims benefit of priority under 35 U.S.C. §119 from Korean Patent Application No. 2005-23746, filed on Mar. 22, 2005, the entire contents of which are incorporated herein by reference.

BACKGROUND

1. Field of the Invention

The present invention relates generally to a semiconductor chip package and a method for manufacturing the same, and more particularly, to a wafer level chip scale package that may include a gap and a method for manufacturing the same.

2. Description of the Related Art

The electronic industry may seek methods, techniques and designs that provide electronic products that may be smaller, lighter, faster, more efficient, operate at higher speeds, provide multiple functions and/or result in improved performance (for example), at an effective cost. One area of development may be package assembly techniques that may provide for packages such as wafer level chip scale packages (WLCSPs), for example.

FIG. 1 is a cross-sectional view of an example of a conventional WLCSP 110.

Referring to FIG. 1, the WLCSP 110 may include a semiconductor chip 111 that may have an electrode pad 112. A passivation layer 113 may be provided on the semiconductor chip 111. The passivation layer 113 may expose the electrode pad 112. A first insulating layer 115 may be provided on the passivation layer 113. The first insulating layer 115 may expose the electrode pad 112. A seed metal layer 117 may be provided on the first insulating layer 115 and the electrode pad 112. A redistribution line 123 may be provided on the seed metal layer 117. A second insulating layer 125 may be provided on the first insulating layer 115 and the redistribution line 123. The second insulating layer 125 may expose a portion of the redistribution line 123. The exposed portion of the redistribution line 123 may provide a bump land 123a. A solder bump 129 may be provided on the bump land 123a. The electrode pad 112 of the semiconductor chip 111 may be electrically connected to the solder bump 129 via the redistribution line 123.

The conventional WLCSP 110 may produce chip scale packages at a wafer level. However, the wafer level chip scale package 110 may not have a substrate between the semiconductor chip 111 and the solder bump 129. This may reduce solder joint reliability when the WLCSP 110 may be mounted on another device (e.g., a main substrate and/or a module substrate). For example, cracks may occur at a solder joint due to stresses which may be caused by (for example) a difference in coefficients of thermal expansion (CTE) between the semiconductor chip 111 and the main substrate and/or the module substrate.

In an effort to avoid such shortcomings, a WLCSP 210 may be provided as shown in FIG. 2.

Referring to FIG. 2, the WLCSP 210 may have a metal post 227. The metal post 227 may be provided on a bump land 223a and may be embedded in a solder bump 229. The metal post 227 may support and/or secure the solder bump 229. The metal post 227 may reduce the likelihood of cracks, which may occur at a solder joint, thereby improving solder joint reliability.

However, fabricating the WLCSP 210 may involve additional processes for forming the metal post 227, thereby resulting in a more complicated manufacturing process. For example, after forming the second insulating layer 225, a series of processes may follow, such as processes for applying, exposing and developing a photoresist, forming a metal post and removing the photoresist. Therefore, the manufacture of the WLCSP 210 may consume increased time and costs.

Another effort to avoid the solder joint shortcoming may involve providing a WLCSP 310, as shown in FIG. 3.

Referring to FIG. 3, the WLCSP 310 may have an air cavity 327. The air cavity 327 may be provided under a bump land 323a. When the wafer level chip scale package 310 may be mounted on a main substrate and/or a module substrate (for example), the air cavity 327 may absorb stresses, which may occur due (for example) to a difference in CTEs between a semiconductor chip 311 and the main substrate and/or the module substrate. Therefore, solder joint reliability may be improved. Further, since air may have a low dielectric constant, the pad capacitance may be reduced and the signal transmission speed may be improved.

However, fabricating the WLCSP 310 may involve additional processes for forming the air cavity 327, thereby resulting in a more complicated manufacture process. For example, a process for forming the air cavity 327 may include a series of processes, such as processes for removing a first insulating layer, coating a polymer, leveling the polymer, forming a seed metal layer and a metal connection pad, and removing the polymer. Therefore, the manufacture of the WLCSP 310 may consume increased time and costs.

SUMMARY

According to an example, non-limiting embodiment of the present invention, a package may include a semiconductor chip having a surface supporting an electrode pad. A first insulating layer may be provided on the surface of the semiconductor chip. The electrode pad may be exposed through the first insulating layer. A seed metal layer may be provided on the electrode pad and the first insulating layer. A redistribution line may be provided on the seed metal layer. The redistribution line may be electrically connected to the electrode pad. The redistribution line may have a bump land. A second insulating layer may be provided on the redistribution line. A gap may be provided between a portion of the second insulating layer and the bump land. A solder bump may be provided on the bump land and electrically connected to the redistribution line. The solder bump may surround a periphery of the portion of the second insulating layer.

According to another example, non-limiting embodiment of the present invention a method for manufacturing a package may involve forming a first insulating layer on a surface of a semiconductor chip so that an electrode pad may be exposed through the first insulating layer. A seed metal layer may be formed on the electrode pad and the first insulating layer. A redistribution line may be formed on the seed metal layer. The redistribution line may have a bump land. The redistribution line may have a first opening through which a portion of the seed metal layer may be exposed. The exposed portion of the seed metal layer may be removed. A second insulating layer may be formed on the redistribution line. A gap may be provided between a portion of the second insulating layer and the bump land. A solder bump may be formed on the bump land. The solder bump may cover a periphery of the portion of the second insulating layer.

According to another example, non-limiting embodiment of the present invention, a package may include a semiconductor chip. A conductor may be provided on and electrically connected to the semiconductor chip. The conductor may have a bump land. An insulating layer may be provided on the conductor. A gap may be provided between a portion of the insulating layer and the bump land. A solder bump may be provided on the bump land. The solder bump may surround a periphery of the portion of the insulating layer.

According to another example, non-limiting embodiment of the present invention, a method may involve providing a semiconductor chip. A conductor may be provided on and electrically connected to the semiconductor chip. The conductor may have a bump land. An insulating layer may be provided on the conductor. A gap may be provided between a portion of the insulating layer and the bump land. A solder bump may be provided on the bump land. The solder bump may surround a periphery of the portion of the insulating layer.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

FIG. 5A is a cross-sectional view of providing a first insulating layer.

FIG. 5B is a cross-sectional view of providing a seed metal layer.

FIG. 5C is a cross-sectional view of providing a photoresist layer.

FIG. 5D is a cross-sectional view of providing a redistribution line.

FIG. 5E is a cross-sectional view of providing a first opening.

FIG. 5F is a cross-sectional view of providing a second opening.

FIG. 5G is a cross-sectional view of providing a second insulating layer.

FIG. 5H is a cross-sectional view of providing a gap.

FIG. 5I is a cross-sectional view of patterning a second insulating layer.

The drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example, non-limiting embodiments of the invention.

DETAILED DESCRIPTION OF EXAMPLE, NON-LIMITING EMBODIMENTS

Example, non-limiting embodiments of the present invention will be described more fully with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

An element is considered as being mounted (or provided) "on" another element when mounted (or provided) either directly on the referenced element or mounted (or provided) on other elements overlaying the referenced element. Throughout this disclosure, spatial terms such as "upper," "lower," "under," "over," "above" and "below" (for example) are used for convenience in describing various elements or portions or regions of the elements as shown in the figures. These terms do not, however, require that the structure be maintained in any particular orientation.

Well-known structures and processes are not described or illustrated in detail to avoid obscuring the present invention.

Figure 1:
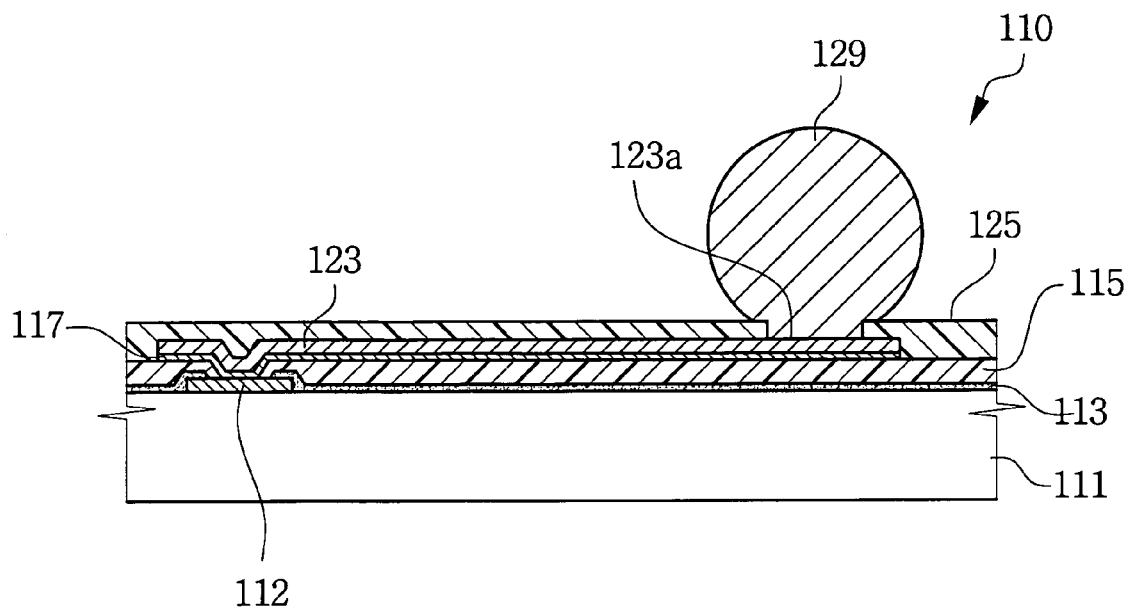
FIG. 1 is a cross-sectional view of an example of a conventional WLCSP.
Figure 2:
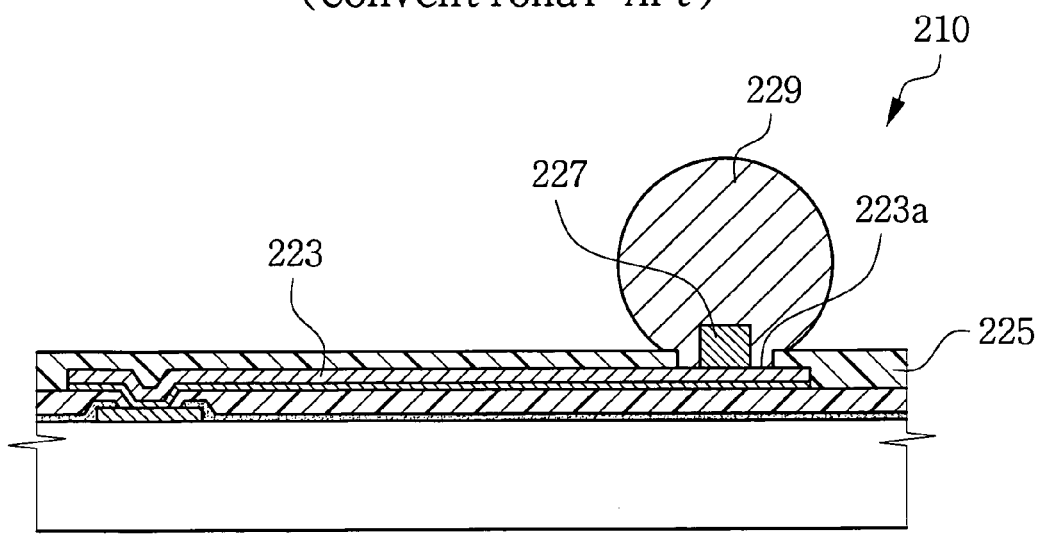
FIG. 2 is a cross-sectional view of another example of a conventional WLCSP.
Figure 3:
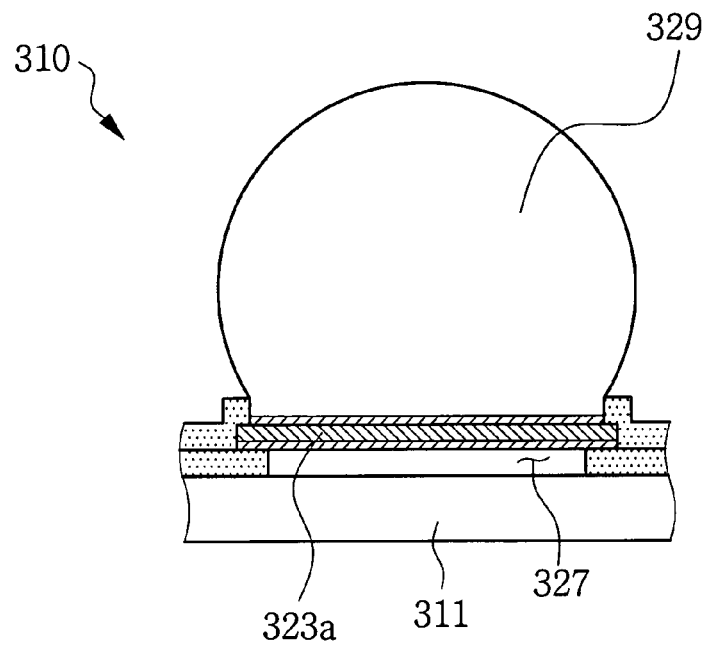
FIG. 3 is a cross-sectional view of another example of a conventional WLCSP.
Figure 4:
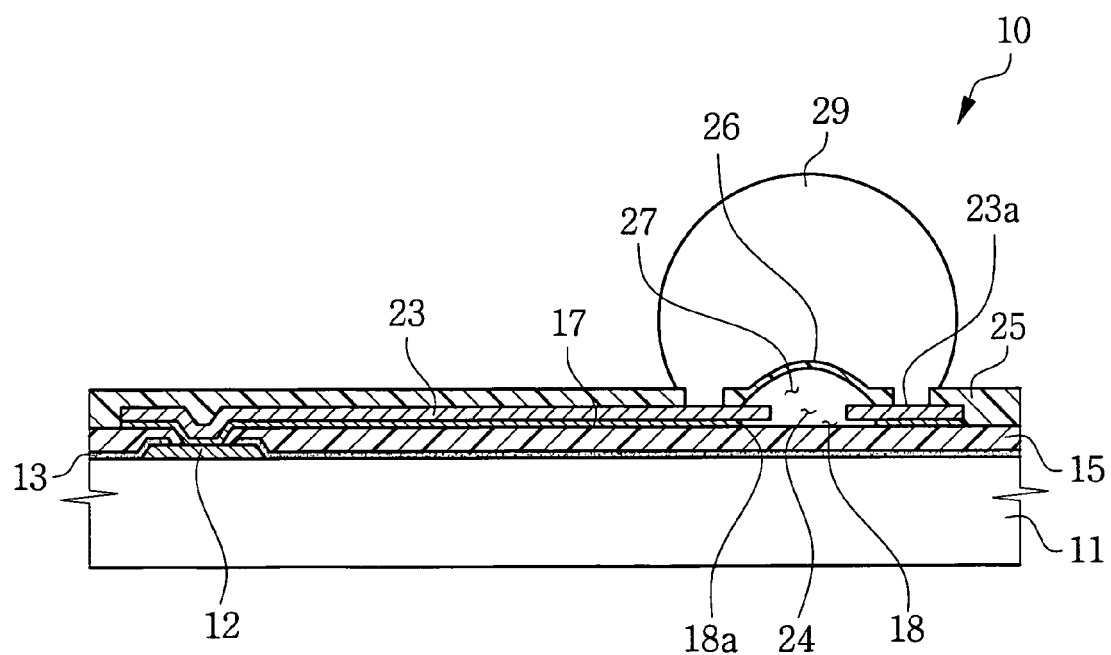
FIG. 4 is a cross-sectional view of a WLCSP in accordance with an example, non-limiting embodiment of the present invention.

FIG. 4 is a cross-sectional view of a WLCSP 10 in accordance with an example, non-limiting embodiment of the present invention.

Referring to FIG. 4, the WLCSP 10 may include a semiconductor chip 11. The semiconductor chip 11 may have an upper surface that may support an electrode pad 12 and a passivation layer 13. The passivation layer 13 may cover the upper surface of the semiconductor chip 11. The electrode pad 12 may be exposed through the passivation layer 13. The passivation layer 13 may (for example) protect integrated circuits provided in the semiconductor chip 11.

A first insulating layer 15 may be provided on the passivation layer 13. The first insulating layer 15 may (for example) serve as an electrical insulation layer and/or a thermal stress relief layer. The first insulating layer 15 may be fabricated from polymer materials, such as photosensitive polyimide, benzo-cyclo-butene, and/or epoxy, for example.

A seed metal layer 17 may be provided on the electrode pad 12 and the first insulating layer 15. A redistribution line 23 may be provided on the seed metal layer 17. The seed metal layer 17 may be a single layer (as shown) or a multi-layered layer. The seed metal layer 17 may serve as an adhesive layer, a diffusion preventive layer, and/or a plating electrode, for example. The seed metal layer 17 may be fabricated from alloys, such as Ti/Cu, Cr/Cu, Cr/Ni, Cr/V, Ti/Cu/Ni, and/or Cr/Ni/Au, for example. The redistribution line 23 may be fabricated from materials having good electrical conductivity, such as Cu, for example. The redistribution line 23 may be electrically connected to the electrode pad 12.

The redistribution line 23 may have a first opening 24. The first opening 24 may be provided at a bump land 23a of the redistribution line 23. By way of example only, the first opening 24 may extend through the bump land 23a. The first opening 24 may have the shape of a circle, a square or a grid. In alternative embodiments, the first opening 24 may have any other geometric shape. The shape of the first opening 24 may correspond to the shape of a mask pattern that may be used to form the redistribution line 23. The seed metal layer 17 may have a second opening 18. The second opening 18 may be contiguous with the first opening 24. The second opening 18 may include an undercut portion 18a. The undercut portion 18a may be provided in the seed metal layer 17 and under the redistribution line 23.

A second insulating layer 25 may be provided on the first insulating layer 15 and the redistribution line 23. A gap 27 may be provided between the ball land 23a and a portion 26 of the second insulating layer 25. The gap 27 may be contiguous with the first opening 24 in the redistribution line 23. In this example embodiment, the gap 27, the first opening 24 and the second opening 18 may be in fluid communication with each other. The second insulating layer 25 may be patterned to expose a portion of the ball land 23a. The portion 26 of the second insulating layer 25 may cover the gap 27. By way of example only, the portion 26 covering the gap 27 may extend upward from the redistribution line 23 further than the other portions of the second insulating layer 25 so that size of the gap 27 may be increased. In this example embodiment, the gap 27, the first opening 24 and the second opening 18 may have symmetrical shapes. In alternative embodiments, the gap 27, the first opening 24 and the second opening 18 may have asymmetrical shapes. The second insulating layer 25 may be fabricated from polymer materials, for example.

An external connection terminal, e.g., a solder bump 29, may be provided on the ball land 23a of the redistribution line 23. An under-bump metallization (UBM) layer may be provided under the solder bump 29. The UBM layer may be fabricated from alloys, for example. In this case, the gap 27 may be provided on the UBM layer.

The gap 27 may relieve stresses at a solder joint and reduce the likelihood of cracks that may occur due to a difference in CTEs and/or mechanical shocks, for example. Since a gas (e.g., air), which may be provided in the gap 27, may have a relatively low dielectric constant, the gap 27 may reduce the pad capacitance and/or improve the signal transmission speed, for example.

An example method that may be implemented for manufacturing a WLCSP will be described with reference to FIGS. 5A through 5I.

Figure 5A:
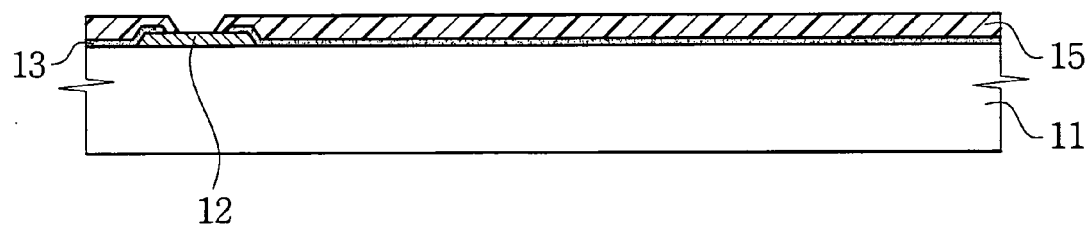
FIGS. 5A through 5I are cross-sectional views of a method that may be implemented for manufacturing a WLCSP in accordance with an example, non-limiting embodiment of the present invention.

Referring to FIG. 5A, a semiconductor chip 11 may have an upper surface that may support an electrode pad 12 and a passivation layer 13. The passivation layer 13 may cover the upper surface of the semiconductor chip 11. The electrode pad 12 may be exposed through the passivation layer 13. A first insulating layer 15 may be provided on the passivation layer 13. The electrode pad 12 may be exposed through the first insulation layer 15. For example, the first insulating layer 15 may be formed on the passivation layer 13 using a spin coating method. A portion of the passivation layer 13 may be removed using photolithography (for example) to expose the electrode pad 12.

Figure 5B:
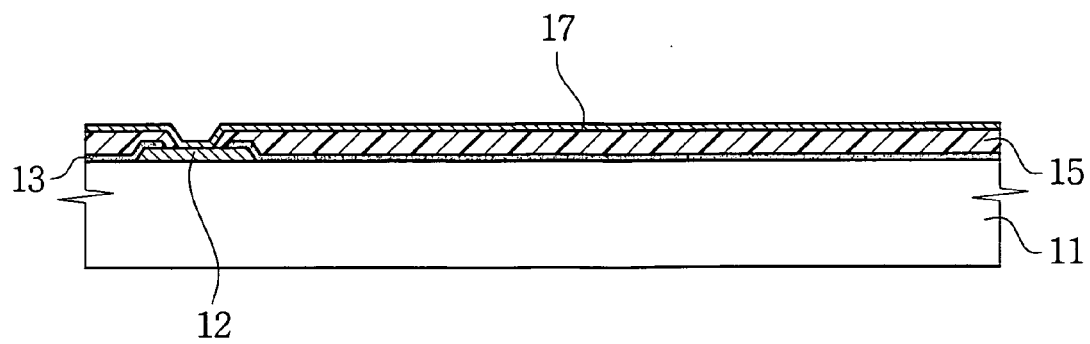

Referring to FIG. 5B, a seed metal layer 17 may be provided on the electrode pad 12 and the first insulating layer 15. The seed metal layer 17 may be formed using a deposition method and/or a sputtering method, for example. The seed metal layer 17 may be a single layer or a multi-layered layer fabricated from metal alloys, for example.

Figure 5C:
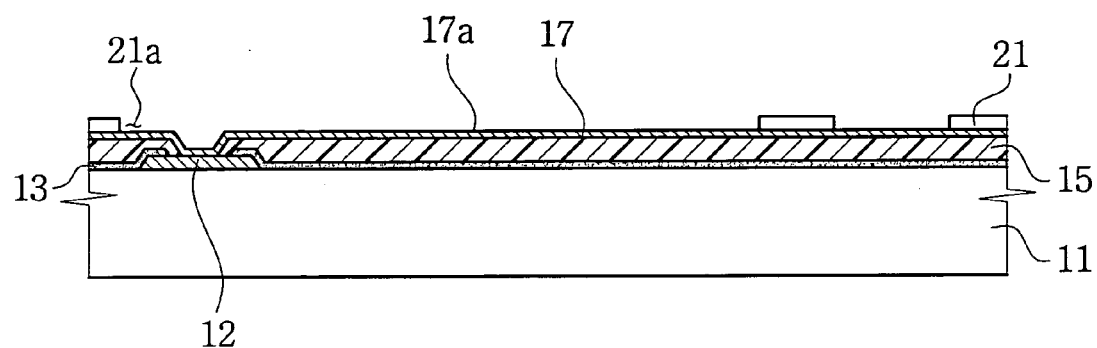

Referring to FIG. 5C, a photoresist layer 21 may be provided on the seed metal layer 17. A photoresist may be applied on the seed metal layer 17. The photoresist may be exposed and developed to form an open area 21a. The open area 21a may expose a portion 17a of the seed metal layer 17.

Figure 5D:
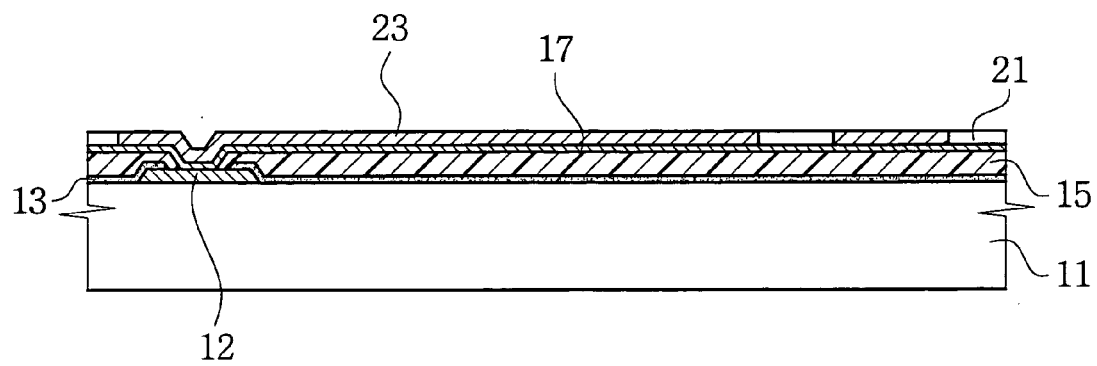
Figure 5E:
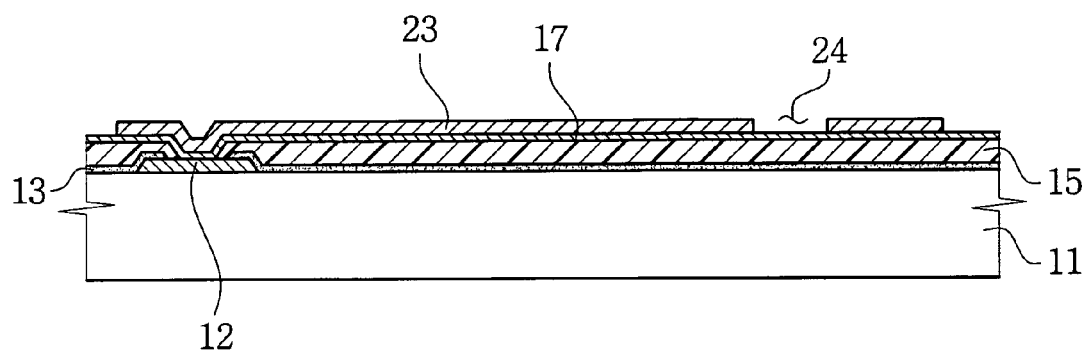
Figure 6A:
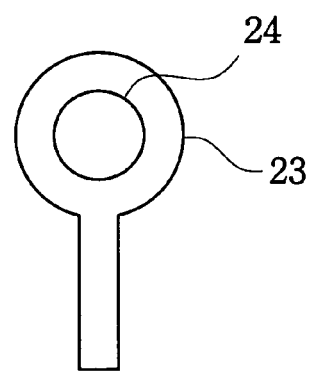
FIGS. 6A through 6C are plan views of example redistribution lines.
Figure 6B:
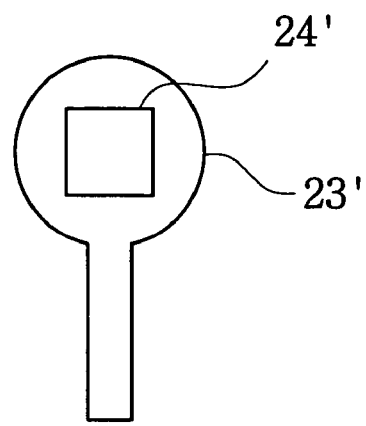
Figure 6C:
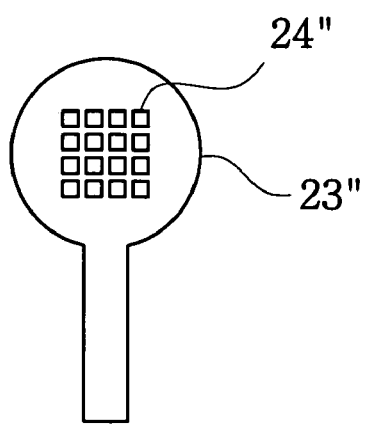

Referring to FIG. 5D, a redistribution line 23 may be provided on the exposed portion 17a of the seed metal layer 17. A portion of the redistribution line 23 may provide the bump land 23a. The photoresist layer 21 may be removed, as shown in FIG. 5E, so that a first opening 24 may be provided in the redistribution line 23. As shown in FIG. 6A, the first opening 24 in the redistribution line 23 may have a circular shape. As shown in FIG. 6B, the first opening 24' in the redistribution line 23' may have a square shape. As shown in FIG. 6C, the first opening 24" in the redistribution line 23" may have a grid shape. In alternative embodiment, the first opening 24 may have any geometric shape. It will be appreciated that the shape of the first opening in the redistribution line may correspond to the pattern of the photoresist layer 21. The redistribution line 23 may be formed through an electroplating process (for example) using the seed metal layer 17.

Figure 5F:
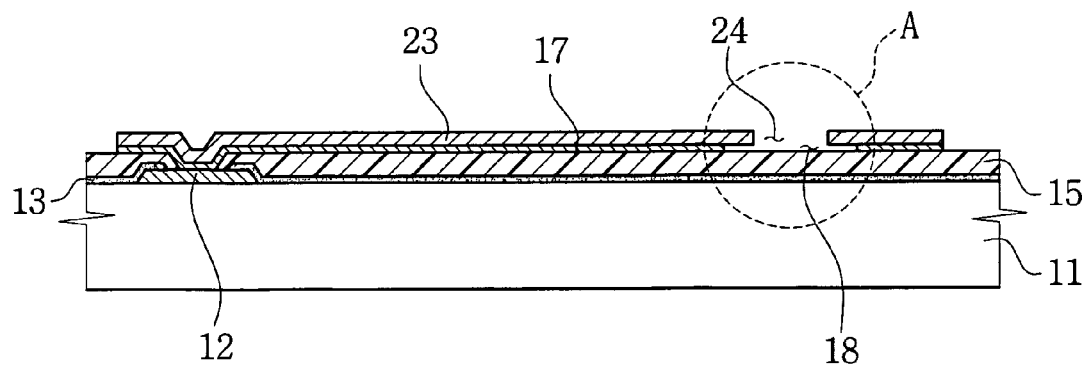
Figure 7:
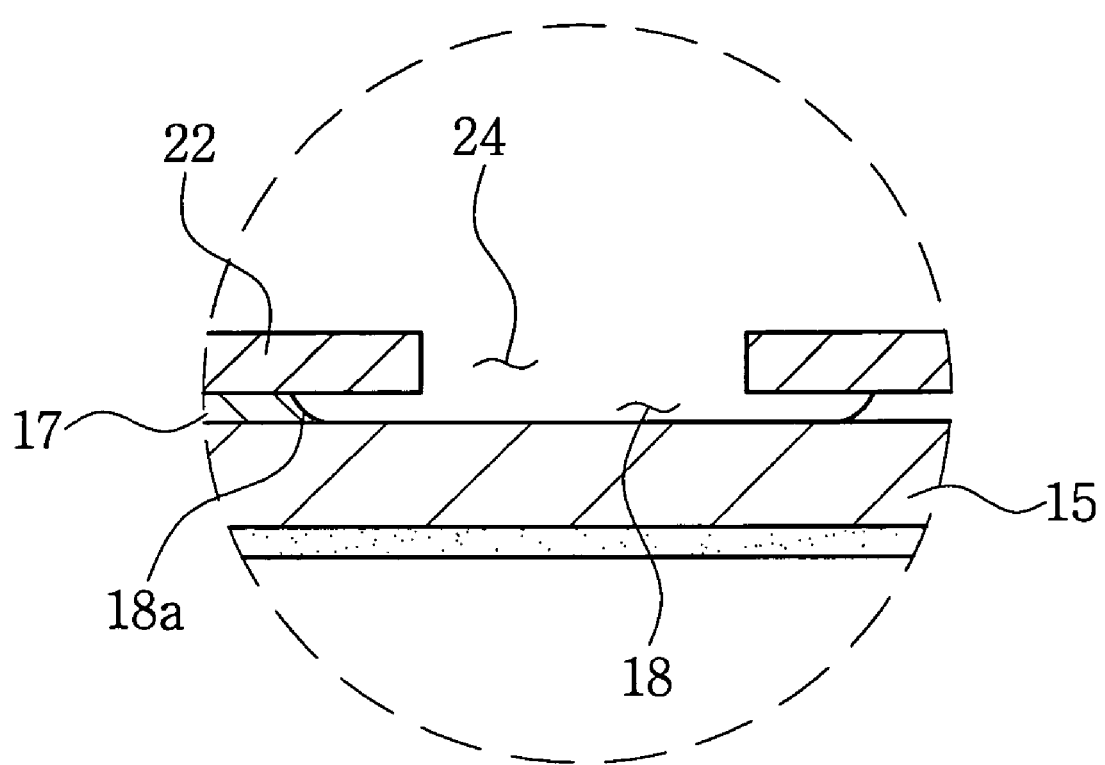
FIG. 7 is an enlarged cross-sectional view of section A of FIG. 5F.

Referring to FIG. 5F, the portion of the seed metal layer 17, which may be exposed through the first opening 24, may be removed through an isotropic etching method (for example) using the redistribution line 23 as a mask. An anisotropic etching method may also be used to remove portions of the seed metal layer 17 below the redistribution line 23 to create an undercut portion 18a under the redistribution line 23, as shown in FIG. 7. The seed metal layer 17 may have a second opening 18 including the undercut portion 18a. The width of the second opening 18 may be larger than that of the first opening 24. In this way, the amount of gas (e.g., air) that may be trapped in the first and the second openings 24 and 18 may be increased.

Figure 5G:
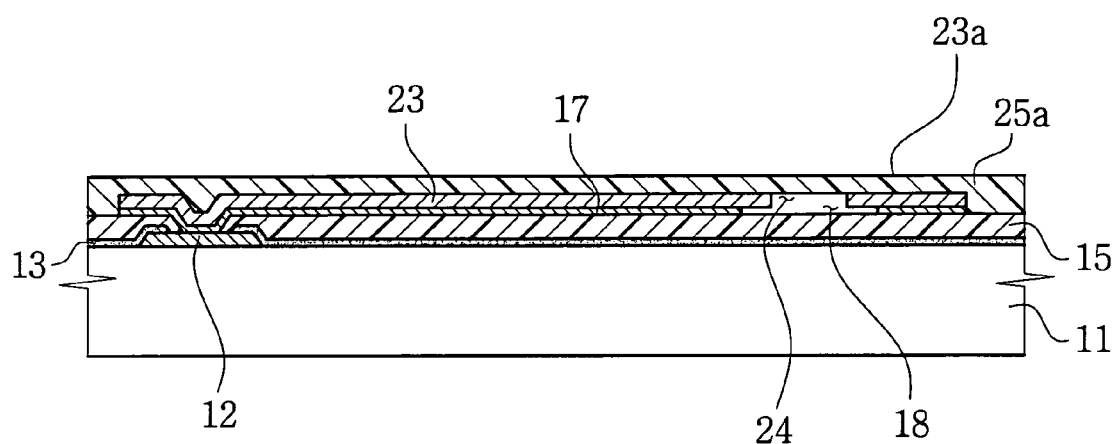
Figure 5H:
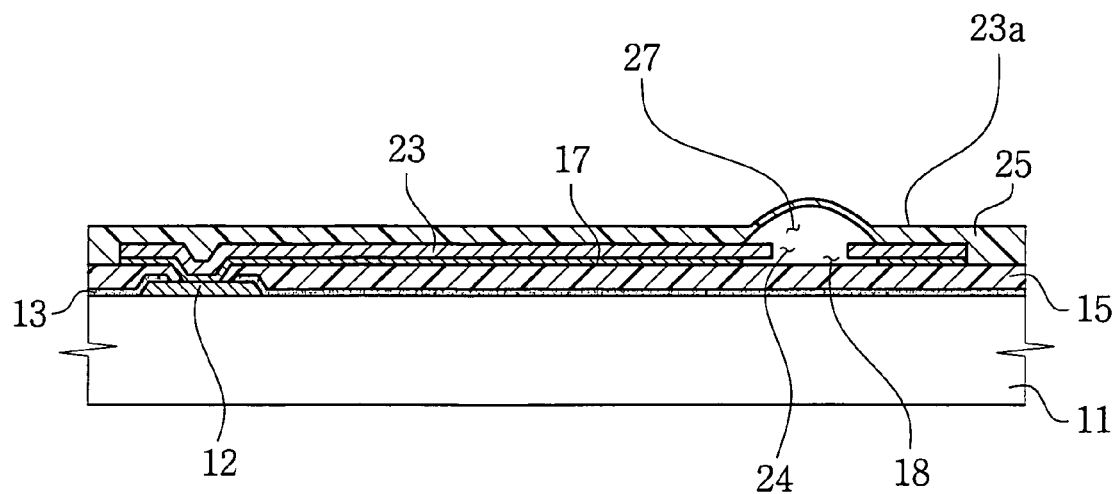

Referring to FIG. 5G, a polymer layer 25a may be provided on the first insulating layer 15 and the redistribution line 23. A gap 27 may be formed during curing (for example) of the polymer layer 25a to form a second insulting layer 25. The second insulating layer 25 may be patterned to expose a portion of the ball land 23a.

Figure 8:
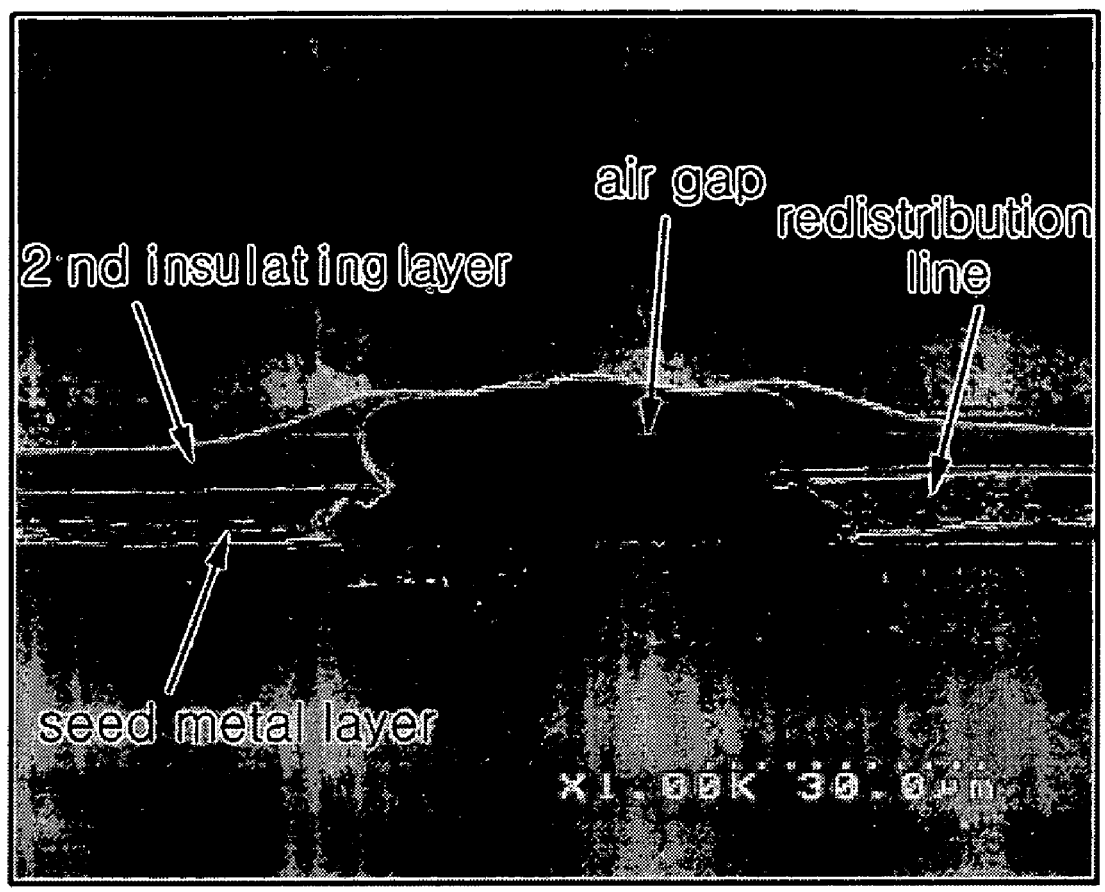
FIG. 8 is a scanning electron microscopic photograph of an example gap.

For example, an insulating material (e.g., a polymer) may be applied on the redistribution line 23 and the first insulating layer 15 to provide the polymer layer 25a. The polymer layer 25a may be formed using a spin coating method, for example. The polymer layer 25a may be baked, for example. During the baking process, gas (e.g., air) in the first and the second openings 24 and 18 may be heated. The heated gas may expand and push against the polymer layer 25a, which may cause the polymer layer 25a to expand and bulge away from the redistribution line 23. Before the gas may be discharged, the polymer layer 25a may be cured to form the gap 27. A portion 26 of the second insulating layer 25, which may cover the gap 27, may have reduced thickness as compared to the other portions of the second insulating layer 25. FIG. 8 shows an example gap 27.

As the height of the gap 27 increases, the stress relieving effect of the gap 27 may increase. The bulk of the gap 27 may be dependent on (among other things) the size of the first and the second openings 24 and 18.

Figure 5I:
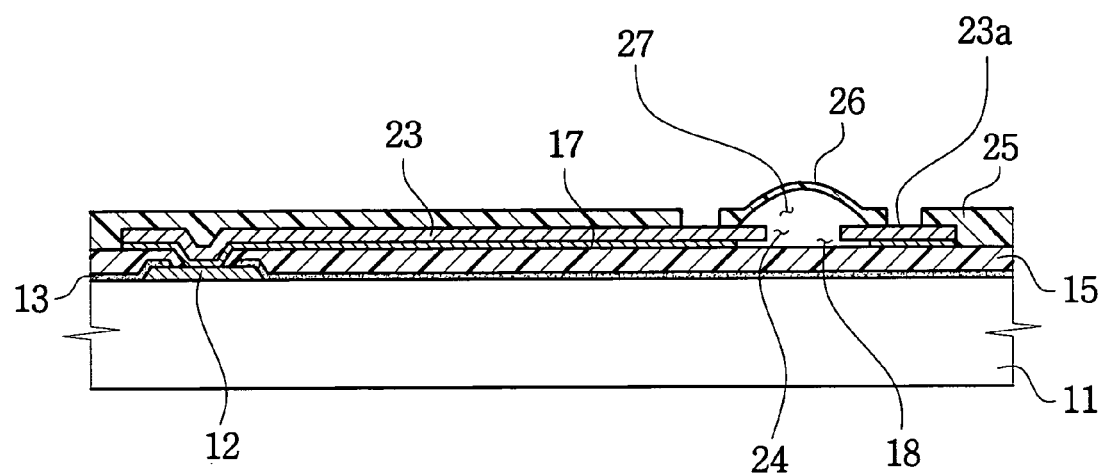

Referring to FIG. 5I, a patterning process, which may include exposure and development (for example), may be performed on the second insulating layer 25 so that a portion of the ball land 23a may be exposed. The second insulating layer 25 may be cured.

Returning to FIG. 4, a solder bump 29 may be provided on the bump land 23a. The solder bump 29 may be attached to the bump land 23a using a reflow process, for example. The gap 27 may be embedded in the solder bump 29.

The example method for manufacturing a WLCSP may eliminate additional processes for forming a gap. A first opening may be provided in the redistribution line. An undercut portion may be provided in the seed metal layer. During forming of a second insulating layer, gas (e.g., air) may be trapped in the second insulating layer, thereby forming the gap.

A WLCSP having a gap in accordance with an example, non-limiting embodiment of the present invention may relieve stresses at a solder joint and reduce the likelihood of cracks, which may occur due to a difference in CTEs and/or mechanical shocks (for example), thereby improving solder joint reliability.

A method for manufacturing a WLCSP in accordance with an example, non-limiting embodiment of the present invention may provide a simple manufacturing process, thereby reducing time and/or costs of a manufacturing process.

Although example, non-limiting embodiments of the present invention have been described in detail, it will be understood that many variations and/or modifications of the basic inventive concepts, which may appear to those skilled in the art, will still fall within the spirit and scope of the example embodiments of the present invention as defined in the appended claims.

What is claimed is:

1. A package comprising:
    a semiconductor chip having a surface supporting an electrode pad;
    a first insulating layer provided on the surface of the semiconductor chip, the electrode pad being exposed through the first insulating layer;
    a seed metal layer provided on the electrode pad and the first insulating layer;
    a redistribution line provided on the seed metal layer and electrically connected to the electrode pad, the redistribution line having a bump land;
    a second insulating layer provided on the redistribution line so that a gap is provided between a portion of the second insulating layer and the bump land; and
    a solder bump provided on the bump land and electrically connected to the redistribution line, the solder bump surrounding a periphery of the portion of the second insulating layer.

2. The package of claim 1, wherein the redistribution line has a first opening contiguous with the gap.

3. The package of claim 2, wherein the seed metal layer has a second opening including an undercut portion, the second opening being contiguous with the first opening of the redistribution line.

4. The package of claim 2, wherein the first opening has one of a circular shape, a square shape and a grid shape.

5. The package of claim 1, wherein the portion of the second insulating layer extends further from the redistribution line than other portions of the second insulating layer.

6. The package of claim 1, wherein the second insulating layer is fabricated from polymers.

7. A package comprising:
    a semiconductor chip;
    a conductor provided on and electrically connected to the semiconductor chip, the conductor having a bump land;
    an insulating layer provided on the conductor so that a gap is provided between a portion of the insulating layer and the bump land; and
    a solder bump provided on the bump land, the solder bump surrounding a periphery of the portion of the insulating layer.

8. The package of claim 7, wherein the gap is filled with a gas.

9. The package of claim 8, wherein the gas is air.

10. The package of claim 7, wherein an opening is provided through the bump land, the opening being contiguous with the gap.

* * * * *